United States Patent
Utano et al.

(10) Patent No.: US 8,716,939 B2
(45) Date of Patent: May 6, 2014

(54) PLASMA IGNITION SYSTEM, PLASMA IGNITION METHOD, AND PLASMA GENERATING APPARATUS

(75) Inventors: Tetsuya Utano, Tokyo (JP); Toru Maeda, Tokyo (JP); Jun'ichi Takahira, Saitama (JP); Masanori Hamajima, Saitama (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 13/490,654

(22) Filed: Jun. 7, 2012

(65) Prior Publication Data

US 2012/0280618 A1   Nov. 8, 2012

Related U.S. Application Data

(63) Continuation of application No. PCT/JP2010/062780, filed on Jul. 29, 2010.

(30) Foreign Application Priority Data

Dec. 10, 2009   (JP) .................................. 2009-280581

(51) Int. Cl.
*H01J 7/24* (2006.01)

(52) U.S. Cl.
USPC ............ 315/111.41; 315/111.21; 315/111.31; 315/111.51; 315/308

(58) Field of Classification Search
USPC ................. 315/111.21–111.41, 308; 118/712, 118/723 R
See application file for complete search history.

(56) References Cited

U.S. PATENT DOCUMENTS

| | | | | |
|---|---|---|---|---|
| 3,678,381 | A | * | 7/1972 | Beaudry .......................... 324/95 |
| 5,394,061 | A | | 2/1995 | Fujii |
| 6,155,199 | A | * | 12/2000 | Chen et al. ................... 118/723 I |
| 6,313,430 | B1 | * | 11/2001 | Fujioka et al. ........... 219/121.57 |
| 7,332,981 | B2 | * | 2/2008 | Matsuno ....................... 333/17.3 |
| 7,571,732 | B2 | | 8/2009 | Takizawa et al. |
| 7,642,879 | B2 | * | 1/2010 | Matsuno ....................... 333/17.3 |
| 7,796,368 | B2 | * | 9/2010 | Kotani et al. .................... 361/82 |

(Continued)

FOREIGN PATENT DOCUMENTS

| | | |
|---|---|---|
| JP | 62-70567 | 4/1987 |
| JP | 3-219082 | 9/1991 |

(Continued)

OTHER PUBLICATIONS

International Search Report dated Nov. 2, 2010, from corresponding International Application No. PCT/JP2010/062780.

*Primary Examiner* — Douglas W Owens
*Assistant Examiner* — Srinivas Sathiraju
(74) *Attorney, Agent, or Firm* — Katten Muchin Rosenman LLP

(57) ABSTRACT

Provided is a plasma ignition technique allowing easy and reliable ignition and reignition of plasma without monitoring or manual handling. A plasma ignition system according to this technique is provided with a radio-frequency power supply configured to supply a predetermined high frequency signal to an applied electrode for generating plasma; a matching device configured to match impedance on a side of the radio-frequency power supply and impedance on a side of the applied electrode; a forward wave/reflected wave detector configured to detect a forward wave and a reflected wave of the high frequency signal; a high-voltage generator configured to generate a predetermined high voltage; and a controller configured to superimpose the high voltage on the high frequency signal when a ratio of the reflected wave to the forward wave is greater than a first threshold value.

7 Claims, 11 Drawing Sheets

(56) References Cited

U.S. PATENT DOCUMENTS

| | | |
|---|---|---|
| 7,908,104 B2 * | 3/2011 | Tetsuka et al. .................. 702/76 |
| 8,169,162 B2 * | 5/2012 | Yuzurihara et al. ............ 315/308 |
| 8,216,421 B2 * | 7/2012 | Nishida et al. ............ 156/345.48 |
| 8,286,581 B2 * | 10/2012 | Hayami et al. ............ 118/723 R |
| 2007/0235060 A1 | 10/2007 | Takizawa et al. |
| 2008/0023525 A1 | 1/2008 | Maeda et al. |
| 2012/0021132 A1 | 1/2012 | Shimizu et al. |
| 2012/0247680 A1 * | 10/2012 | Nishida et al. ............ 156/345.49 |

FOREIGN PATENT DOCUMENTS

| | | |
|---|---|---|
| JP | 6-215894 | 8/1994 |
| JP | 10-275698 | 10/1998 |
| JP | 2001-35693 | 2/2001 |
| JP | 2002-8894 | 1/2002 |
| JP | 2002-343599 | 11/2002 |
| JP | 2003-328138 | 11/2003 |
| JP | 2006-104545 | 4/2006 |
| JP | 2007-109457 | 4/2007 |
| JP | 2007-207475 | 8/2007 |
| JP | 2007-266605 | 10/2007 |
| JP | 2008-34735 | 2/2008 |
| JP | 2008-91218 | 4/2008 |
| JP | 2008-210599 | 9/2008 |
| WO | 2008/023523 | 2/2008 |

* cited by examiner

PLASMA IGNITION SYSTEM, PLASMA IGNITION METHOD, AND PLASMA GENERATING APPARATUS

TECHNICAL FIELD

The present invention relates to a plasma ignition system, a plasma ignition method, and a plasma generating apparatus.

BACKGROUND ART

Plasma is used in various production sites. For example, in the field of manufacturing of semiconductor circuits, a surface of a semiconductor circuit to be bonded is cleaned using plasma.

As one example of plasma generating apparatuses, Japanese Unexamined Patent Application Publication No. 2002-343599 discloses an apparatus configured such that a wire is disposed at an axial core of a glass tube in which an argon gas is introduced, and that a high frequency coil and an ignition coil are wound at a tip portion of the glass tube (Patent Document 1). According to this apparatus, after an argon gas is introduced into the glass tube and a flow of a plasma gas is stabilized, a high frequency power is supplied to the high frequency coil from a high frequency power source, and then a high voltage is applied to the ignition coil, and whereby a discharge is generated and plasma is generated.

Further, Japanese Unexamined Patent Application Publication No. 2003-328138 discloses a plasma ignition mechanism of igniting plasma by applying a high voltage to a plasma ignition coil including a wire from an igniter, and by inducing a discharge between the plasma ignition coil and the wire (FIG. 3, Patent Document 2).

Moreover, Japanese Unexamined Patent Application Publication No. 2006-104545 discloses a micro plasma reactor configured such that around an inner tube of a plasma flame off through which a high-melting conducting wire is inserted is enclosed by an outer tube of a plasma flame off in which a mixed gas circulates, and a discharge is started by an externally provided igniter (FIGS. 1-6, Patent Document 3).

Furthermore, Japanese Unexamined Patent Application Publication No. H06-215894 discloses a radio-frequency plasma power supply device that supplies high frequency power between electrodes in a plasma chamber via an impedance matching circuit (Patent Document 4). According to this device, a voltage value supplied to an FET of a power amplifier is set to be low during a time period until power output impedance and impedance in the plasma chamber match, thereby preventing an FET from being damaged due to a reflected wave.

PRIOR ART DOCUMENTS

Patent Documents

Patent Document 1: Japanese Unexamined Patent Application Publication No. 2002-343599
Patent Document 2: Japanese Unexamined Patent Application Publication No. 2003-328138
Patent Document 3: Japanese Unexamined Patent Application Publication No. 2006-104545
Patent Document 4: Japanese Unexamined Patent Application Publication No. H06-215894

SUMMARY OF THE INVENTION

Problems To Be Solved By the Invention

However, in the plasma generating apparatus, plasma often becomes unstable or disappears when a flow of an inert gas for plasma deteriorates or such. If plasma is unstable or disappears, defects are developed in many of products such as semiconductor circuits. Such defects can further result in disadvantageous effects such as heat generation at a section that is not the defective section. Taking time before the disappearance of plasma is found results in defects developed in many products. Therefore, the plasma generating apparatus disclosed in Patent Documents described above requires monitoring of the presence of plasma. Further, when the plasma has disappeared, it is necessary to manually reignite plasma. In addition, as it is necessary to conduct plasma ignition work with proper timing in parallel with application work for a high frequency power, a certain level of skill is required for the igniting work.

Thus, an object of the present invention, conceived in view of the above problems, is to provide a plasma ignition technique allowing easy and reliable ignition and reignition of plasma without monitoring or manual handling.

Means For Solving the Problems

In order to address the above problem, a plasma ignition system according to the present invention is provided with: a radio-frequency power supply configured to supply a predetermined high frequency signal to an applied electrode for generating plasma; a matching device configured to match impedance on a side of the radio-frequency power supply and impedance on a side of the applied electrode; a forward wave/reflected wave detector configured to detect a forward wave and a reflected wave of the high frequency signal; a high-voltage generator configured to generate a predetermined high voltage; and a controller configured to superimpose the high voltage on the high frequency signal when a ratio of the reflected wave to the forward wave is greater than a first threshold value.

According to this configuration, when the high frequency signal is supplied to the applied electrode, the impedance on the side of the applied electrode is determined according to a state of the plasma at this time. If the plasma is not appropriately generated at this time, output impedance on a side of the matching device and the impedance on the side of the applied electrode do not match, and therefore the ratio of the reflected wave to the forward wave of the high frequency signal increases. When the ratio of the reflected wave to the forward wave is increased to some extent, it is estimated to be in a state before the ignition, or in a state in which the plasma that has once ignited has disappeared for some reason. Therefore, it is determined that plasma is not ignited if this ratio is greater than the first threshold value that is previously set in order to estimate the state in which the plasma has disappeared, and the high voltage is superimposed on the high frequency signal. By the high voltage, a discharge is generated to the applied electrode, and plasma is ignited or reignited.

In general, "a ratio of a reflected wave to a forward wave" is understood as a ratio of an amplitude value of the reflected wave to an amplitude value of the forward wave, for example, a standing wave ratio (SWR (Standing Wave Ratio) value).

Effects of the Invention

According to the present invention, as a state of plasma ignition is determined based on a ratio of a reflected wave to a forward wave and then the igniting work is conducted, it is possible to easily and reliably ignite and reignite plasma without monitoring or manual handling.

MODES FOR CARRYING OUT THE INVENTION

Figure 1:
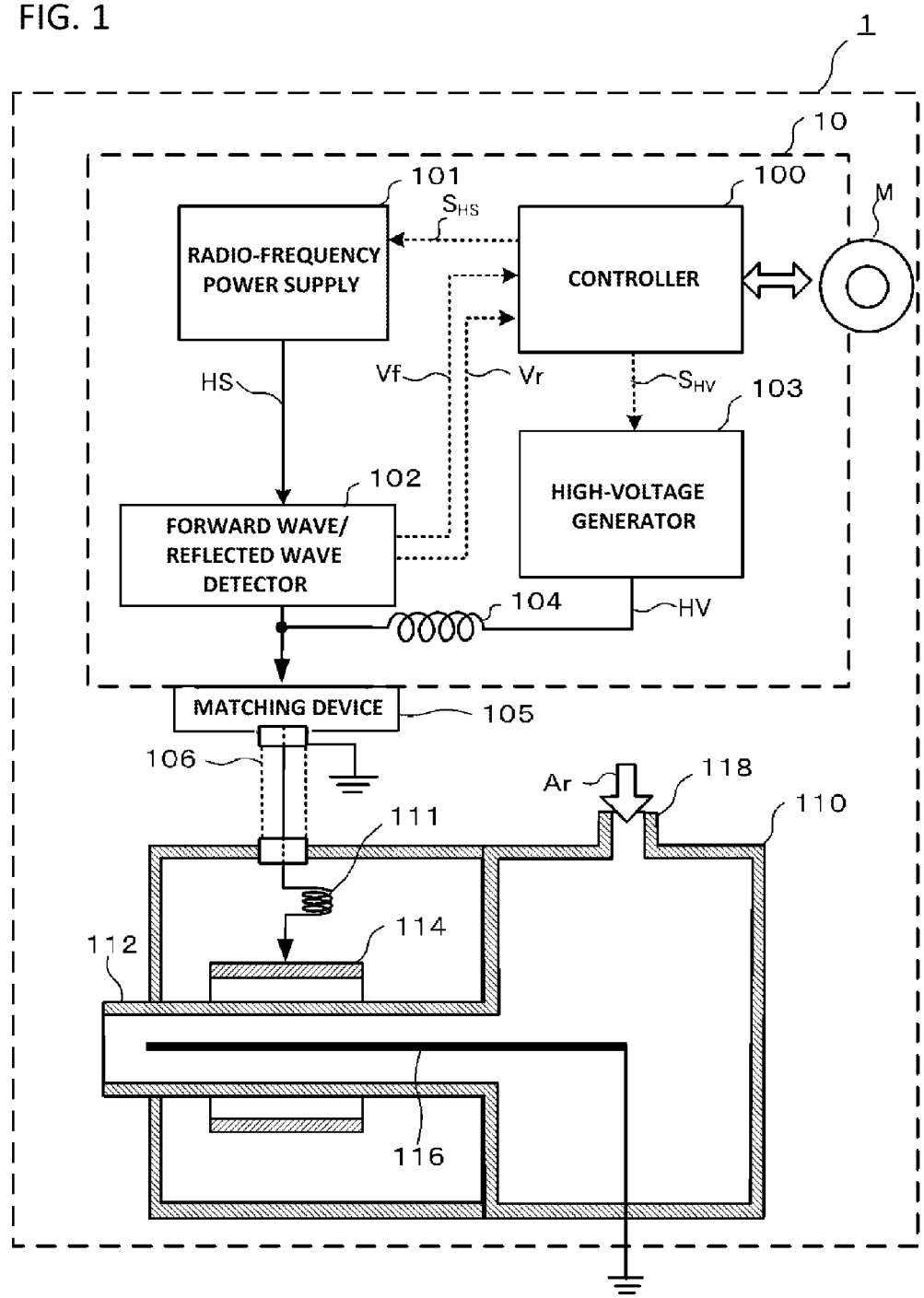
FIG. 1 is a configuration diagram of a plasma generating apparatus including a plasma ignition system according to an embodiment 1.

Hereinafter, embodiments of the present invention will be described. In the following description of the drawings, the same or like steps are represented by the same or like reference numerals. However, block diagrams, waveform charts, and flowcharts in the drawings are illustrated as mere examples. Therefore, specific blocks, a generated waveform, and a processing flow are to be considered in the context of the following description.

Embodiment 1

An embodiment 1 according to the present invention relates to a basic configuration of a plasma ignition system capable of automatically igniting plasma, and configured to superimpose a high voltage on a high frequency signal when a ratio of a reflected wave to a forward wave is greater than a predetermined threshold value, and to stop superimposing the high voltage when the ratio of the reflected wave to the forward wave becomes equal to or smaller than a threshold value after the high voltage is superimposed on the high frequency signal.

FIG. 1 shows a configuration diagram of a plasma generating apparatus including a plasma ignition system according to this embodiment. When used in the manufacturing of semiconductor circuits, a plasma generating apparatus 1 is disposed facing a cleaning surface of a semiconductor circuit as a cleaning target (bonding target), and used to generate plasma to clean the cleaning surface of the semiconductor circuit.

Referring to FIG. 1, the plasma generating apparatus 1 according to this embodiment is provided with a plasma ignition system 10, a gas chamber 110, a reactance correction coil 111, a ceramic tube 112, an applied electrode 114, a ground electrode 116, and a plasma gas supply inlet 118.

The gas chamber 110 is a gas filling chamber for supplying a plasma gas to the ceramic tube 112. Preferably, the plasma gas is an inert gas. It is possible to use $H_2$, $O_2$, $N_2$, or a mixed gas of any of these and an inert gas. As the inert gas, argon (Ar), helium (He), xenon (Xe), and neon (Ne) can be used, and argon (Ar) and helium (He) are most commonly used. To the gas chamber 110, a plasma gas is supplied from the plasma gas supply inlet 118 using a compressor that is not depicted, and pressurized to a predetermined pressure, for example, on the order of 3 atmospheres from atmospheric pressure. The plasma gas is supplied to the plasma gas supply inlet 118 through an arbitrary gas supply system including a gas cylinder, a pressure meter, a flow meter, a pipe, and such.

The ceramic tube 112 is a structure configured by ceramic as an insulation material resistant to high temperatures generated by plasma and high reactivity, and formed to have a predetermined diameter suitable for plasma generation. Instead of ceramic, a material such as silica glass can be used. The ceramic tube 112 is provided with the ground electrode 116 extending along its axial core. The ceramic tube 112 is communicated with the gas chamber 110, and configured such that the pressurized plasma gas from the gas chamber 110 circulates around the ground electrode 116 at high speed. A surface to be plasma-irradiated (a surface of a semiconductor circuit to be cleaned) is positioned facing an opening of the ceramic tube 112 (a left end surface in FIG. 1). Here, it is possible to increase a workable area by bundling more than one ceramic tube 112 (this will be described later in detail as a modified example).

The ground electrode 116 is an electrode that is grounded to generate plasma, and an opposite electrode of the applied electrode 114. The ground electrode 116 is provided extending along the axial core of the ceramic tube 112. A tip of the ground electrode 116 can be disposed within a range covered by the applied electrode 114, or can extend to a portion near a front end of the ceramic tube 112 beyond the range covered by the applied electrode 114. The ground electrode 116 is configured by a wire made of a metal having a high melting point, such as platinum or tungsten, for example, so as to withstand high temperatures of plasma generated from environment. The ground electrode 116 is grounded to outside through the gas chamber 110.

The applied electrode 114 is an electrode that constitutes a pair with the ground electrode 116 and to which a high frequency signal HS is applied from the plasma ignition system 10. The applied electrode 114 faces apart of the ground electrode so as to enclose an exterior of the ceramic tube 112, and has a tubular (annular) cross-section in this embodiment. The applied electrode 114 is made of an oxidation-resistant metal, for example, stainless-steel or a metal provided with oxidation-resistance by such as plating. A distance between the applied electrode 114 and the ground electrode 116 is set based on relation between electrical power of an high frequency signal to be applied and density of plasma desired to be generated. The applied electrode 114 can be provided in a form of a coil wound around the ceramic tube 112, instead of the form having an annular cross-section.

The reactance correction coil 111 is an optional component, which is a coil element connected to the applied electrode 114. The reactance correction coil 111 functions to restrict an influence of reactance (impedance) generated due to a capacitance component between the applied electrode 114 and the ground potential, and to improve a voltage standing wave ratio VSWR that will be later described (that is, to bring the VSWR closer to 1).

The plasma ignition system 10 is provided with a controller 100, a radio-frequency power supply 101, a forward wave/reflected wave detector 102, a high-voltage generator 103, and a superimposed coil 104. Here, the radio-frequency power supply 101 and the high-voltage generator 104 can be provided as a single device.

Further, a matching device 105 is provided between the plasma ignition system 10 and a plasma chamber 110. Here, the matching device 105 and the forward wave/reflected wave detector 102 can be provided as a single device within the plasma ignition system 10.

The radio-frequency power supply 101 is an RF power source configured to supply a predetermined high frequency signal HS to the applied electrode 114 for generating plasma. The high frequency signal HS is a signal having a frequency and a power output suitable for plasma generation. The frequency of the high frequency signal HS suitable for plasma generation is from around 10 KHz to around 1 GHz, and the suitable electrical power output is from around 0.1 W to around 100 W. In this embodiment, the high frequency signal HS is assumed to be a high frequency signal having a frequency of 450 MHz and a power output of 30 W. The radio-frequency power supply 101 is configured by such as an oscillator circuit having an output stage combining a high frequency power transistor and a high frequency transformer. In response to a control signal $S_{HS}$ from the controller 100, the radio-frequency power supply 101 starts or stops generating the high frequency signal HS.

The matching device 105 is provided along a transmission path between the plasma ignition system 10 and the applied electrode 114, and functions to match impedance on a side of the radio-frequency power supply 101 and impedance on a side of the applied electrode 114. The matching device 105 has a filtering circuit structure configured by such as a coil and a variable capacitor, and is designed such that a load impedance in a state in which plasma is stably generated is characteristic impedance $Z_0$ (50Ω, for example) on an output side of the radio-frequency power supply 101. However, a load impedance Z of a plasma gas drastically changes in the process that the plasma gas generates plasma. The load impedance Z also drastically changes depending on such as a type, a flow rate, a pressure, and a temperature of the plasma gas. If the load impedance Z does not match the characteristic impedance $Z_0$ of the radio-frequency power supply 101, a part of the supplied high frequency power returns as a reflected wave, often resulting in reduction of an electrical power efficiency or a damage to an element of the output stage of the radio-frequency power supply 101. The matching device 105 performs impedance matching between the side of the radio-frequency power supply 101 and the side of the applied electrode 114 by an impedance matching function, and reduces generation of a reflected wave to be small.

The forward wave/reflected wave detector 102 is a device configured to detect the forward wave of the high frequency signal HS through the transmission path and the reflected wave reflected from the applied electrode 114. To be specific, physical amounts to be detected are either values of electrical power or amplitude (voltage) values of the forward wave and the reflected wave. For the sake of simplicity, the amplitude values (voltage values) are used herein. Specifically, the forward wave/reflected wave detector 102 is able to detect an amplitude value Vf of the forward wave and an amplitude value Vr of the reflected wave of the high frequency signal HS.

Here, when a signal source and the load impedance Z are respectively connected to both ends of the transmission path of the characteristic impedance $Z_0$, the voltage standing wave ratio (VSWR: Voltage Standing Wave Ratio) on a load side is expressed by expressions 1 and 2 using the forward wave amplitude value Vf and the reflected wave amplitude value Vr.

[Expression 1]

$$VSWR = \frac{1+|\Gamma|}{1-|\Gamma|} \quad (1)$$

$$\Gamma = \frac{Z-Z_n}{Z+Z_n} = \frac{Vr}{Vf} \quad (2)$$

Here, Γ (gamma) is a voltage reflection coefficient. According to the expressions 1 and 2, when the characteristic impedance $Z_0$ and the load impedance Z of the transmission path match, $Z_0=Z$, and the voltage standing wave ratio VSWR=1. The matching device 105 controls to change internal impedance so as to bring the voltage reflection coefficient Γ closer to zero as much as possible.

Here, as the detection of the forward wave amplitude value Vf and the reflected wave amplitude value Vr is essential in the process of impedance matching, the matching device 105 and the forward wave/reflected wave detector 102 can be provided as a single device. However, it is necessary to provide the matching device 105 between an output terminal of the plasma ignition system 10 and the gas chamber 110, as being a device for matching the impedance in the transmission path between the plasma ignition system 10 and the applied electrode 114.

The high-voltage generator 103 is a voltage generation circuit configured to generate a predetermined high voltage HV in response to a control signal $S_{HV}$ from the controller 100. An amplitude value of the high voltage HV is set to be a voltage value with which a discharge sufficient to excite plasma in the plasma gas is provided as a load. For example, the high-voltage generator 103 generates the high voltage HV approximately from 0.8 kV to 2 kV. As an actual circuit, the high-voltage generator 103 is configured by a switching element as the high-voltage generator 103 generates a considerably high voltage as compared to the power-supply voltage, and therefore the high voltage HV is generated as a pulse signal having a predetermined switching frequency (1 kHz, for example). This pulse signal can be outputted as a direct voltage smoothed by a capacitor.

The superimposed coil 104 includes a reactance that gives sufficiently high impedance to the high frequency signal HS, and sufficiently low impedance to the high voltage HV. Accordingly, the superimposed coil 104 functions as an adder for adding the high frequency signal HS and the high voltage HV.

A coaxial cable 106 is a transmission path of the characteristic impedance $Z_0$ through which the high frequency signal HS is supplied to the applied electrode 114. The coaxial cable 106 is connected to the matching device 105 and the gas chamber 110 respectively via connectors, and coating of the coaxial cable 106 is grounded through at least one of the matching device 105 and the gas chamber 110.

The controller 100 is able to operate as a general-purpose computer provided with such as a CPU, a RAM, a ROM, an I/O that are not depicted. The controller 100 is able to perform the functions relating to a plasma ignition method according to the present invention by running a program for executing the predetermined plasma ignition method stored in an internal or external storage medium. Specifically, the controller 100 transmits the control signal $S_{HS}$ to instruct the radio-frequency power supply 101 to start or stop generating the high frequency signal HS. The controller 100 also functions to transmit the control signal $S_{HV}$ to instruct the high-voltage generator 103 to start or stop generating the high voltage HV. Further, the controller 100 is able to receive the forward wave amplitude value Vf and the reflected wave amplitude value Vr from the forward wave/reflected wave detector 102, and to calculate the voltage standing wave ratio VSWR (hereinafter also referred to as "VSWR value") based on the expressions 1 and 2. The controller 100 can be configured so as to be able to execute an instruction to a plasma gas supply system that is not depict, for example, to control to supply or stop supplying the plasma gas. Here, instead of the VSWR value, the controller 100 can use the voltage reflection coefficient Γ calculated based on the expression 2 or the reflected wave amplitude value Vr.

In this case, as unnecessarily high electrical power of the high frequency signal HS generates an adverse effect due to heat generation, it is preferable that supplied electrical power of the high frequency signal HS be variable according to a state of plasma. However, when the electrical power of the high frequency signal HS changes, the reflected wave amplitude value Vr also changes in conjunction. Accordingly, it is preferable to use the ratio of the reflected wave to the forward wave, for example, a standing wave ratio such as the VSWR value, so as not to be affected by a change in the amplitude value.

Here, the program for executing the plasma ignition method according to the present invention can be distributed in a form stored in a storage medium M. Examples of the storage medium M include a variety of types of physical storage media such as a ROM, a USB memory having a flash memory, a USB memory, an SD memory, a memory stick, a memory card, an FD, a CD-ROM, and a DVD-ROM, as well as a transmission medium capable of transmitting the program such as the Internet. Typically, the program is recorded in a ROM of the controller 100 in advance. When the program is recorded in a different detachable type of the storage medium M, the controller 100 includes a storage medium reading device that is not depicted and is configured to read and execute the program recorded in the external storage medium M as illustrated in FIG. 1.

In particular, in this embodiment 1, the controller 100 functions to superimpose the predetermined high voltage HV on the high frequency signal HS when the ratio of the reflected wave to the forward wave (VSWR value) is greater than a predetermined threshold value Vth. Specifically, when it is determined that the VSWR value is detected to some extent, the controller 100 operates to generate the high voltage HV and superimpose the high voltage HV on the high frequency signal HS. Further, the controller 100 functions to stop superimposing the high voltage HV when the ratio of the reflected wave to the forward wave (VSWR value) becomes equal to or smaller than the predetermined threshold value after the high voltage HV is superimposed on the high frequency signal HS. While the threshold value for determining a condition to superimpose the high voltage HV and the threshold value for determining a condition to stop superimposing the high voltage HV can be different values, these threshold values are assumed to be the same in the embodiment 1. A case in which these threshold values are different will be described later according to an embodiment 2.

As described above, the load impedance of the plasma generating apparatus drastically changes in a transition period from a time at which the plasma gas is not yet ignited until the plasma is stably generated. The matching device 105 cannot match impedance in the transition period in which the load impedance continuously changes as an impedance matching operation takes a few seconds. As the impedance is unmatched during this period, generation of the reflected wave increases and the VSWR value exceeds a certain value. According to the plasma ignition system according to the embodiment 1, the threshold value Vth is set to a value with which the VSWR value in a period in which the plasma is unstable can be distinguished from the VSWR value in a period in which the plasma is stable. Therefore, by comparing the detected VSWR value with the threshold value Vth, the controller 100 can determine whether or not the plasma is stably generated. In other words, it is possible to easily identify whether the plasma is being effectively generated or has disappeared (unstable).

Description of Operation

Next, a process of the plasma ignition method according to the embodiment 1 will be described with reference to a flowchart in FIG. 2 and a waveform chart in FIG. 3. The flowchart in FIG. 2 shows a program process executed repeatedly or irregularly as needed.

When it is ready for igniting plasma (hereinafter also referred to as "plasma standby state"), the plasma gas is supplied from the plasma gas supply inlet 118 to the gas chamber 110 based either on the control of the controller 100 or on an administrator's operation. Upon supply of the plasma gas, the plasma gas filled in the gas chamber 110 flows through the ceramic tube 112 at a predetermined pressure. When the flow of the plasma gas stabilized, an instruction of plasma ignition is outputted to the controller 100. While the ignition of the plasma gas here is instructed by the administrator, it is possible that the controller 100 determines right timing for the ignition of the plasma gas by its own.

Figure 2:
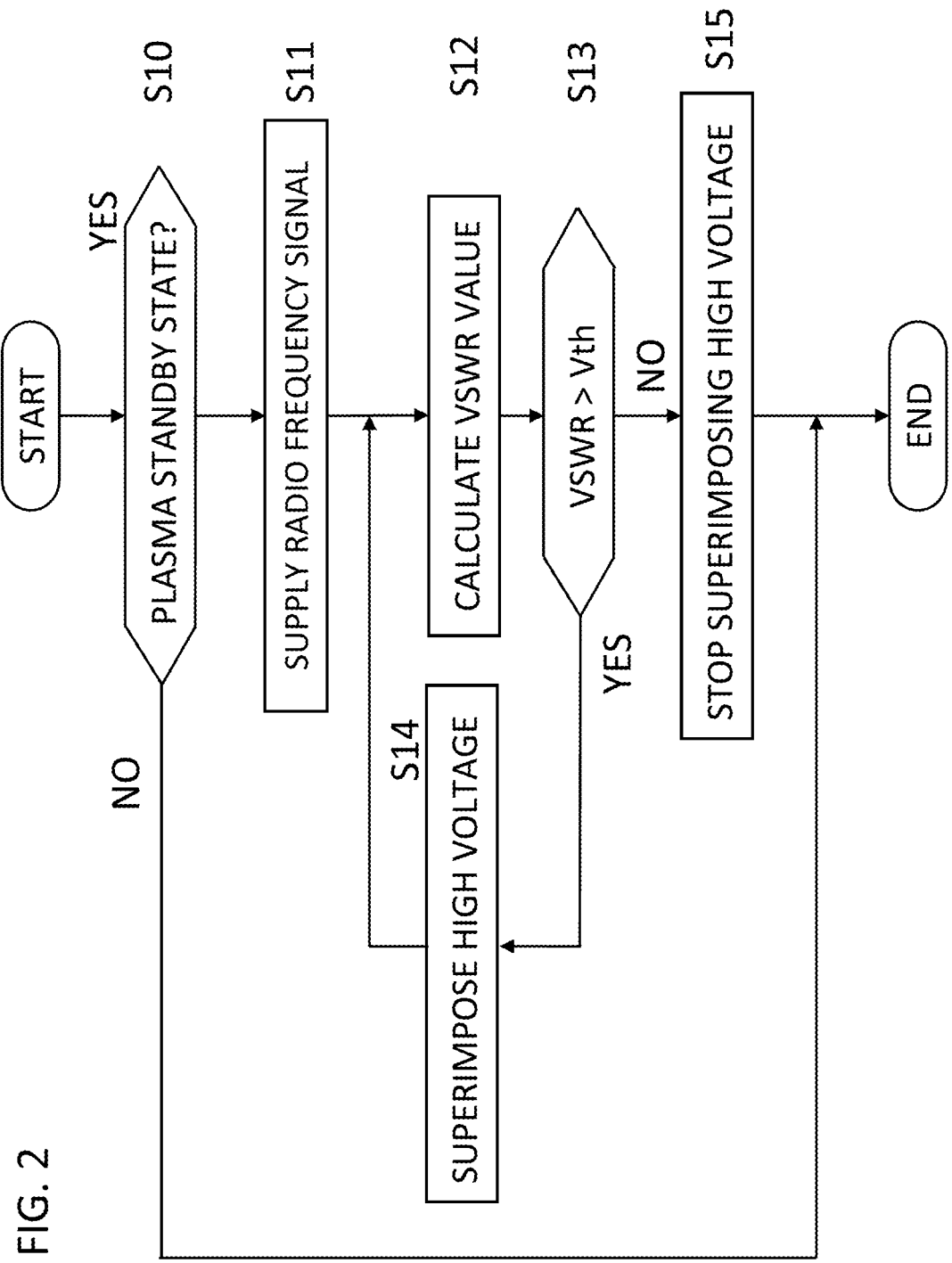
FIG. 2 is a flowchart illustrating a plasma ignition method according to the embodiment 1.

Referring to FIG. 2, the controller 100 determines whether or not a status of the system is in the plasma standby state. It is possible to determine whether or not the system is in the plasma standby state, by detecting a flag recorded in a memory of the controller 100 or operational states of various switches. If it is not the plasma standby state (NO), the process exits this processing loop. If it is the plasma standby state (YES), the process moves to Step S11. In Step S11, the controller 100 transmits the control signal $S_{HS}$ to the radio-frequency power supply 101 to instruct the radio-frequency power supply 101 to supply the high frequency signal HS. In response to the control signal $S_{HS}$, the radio-frequency power supply 101 outputs the high frequency signal HS having a frequency of 450 MHz and an output of 30 W to the transmission path. Upon supply of the high frequency signal HS, a high frequency electromagnetic wave is induced between the applied electrode 114 and the ground electrode 116.

Subsequently, the process moves to Step S12, and, along with the supply of the high frequency signal HS, the forward wave/reflected wave detector 103 detects the forward wave amplitude value Vf and the reflected wave amplitude value Vr reflected on the applied electrode 114 and the controller 100 calculates the VSWR value. The load impedance on the side of the applied electrode 114 becomes equal to the characteristic impedance of the radio-frequency power supply 101 in a state in which plasma is generated appropriately. At the stage prior to the plasma generation, the load impedance on the side of the applied electrode 114 is largely different from the characteristic impedance $Z_0$. Accordingly, the reflected wave amplitude value Vr detected by the forward wave/reflected wave detector 102 becomes large. Therefore, the VSWR value calculated by the controller 100 becomes relatively large.

Figure 3:
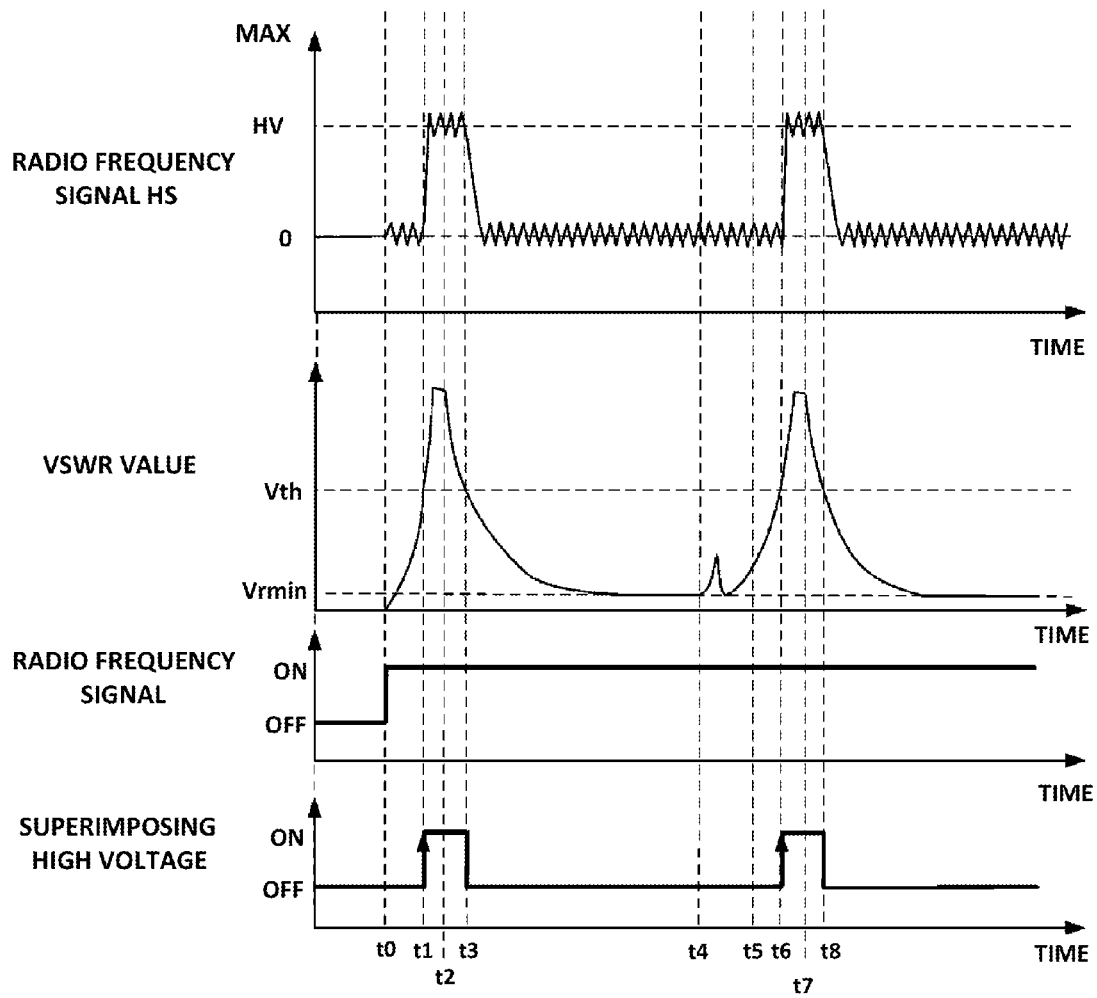
FIG. 3 is a waveform chart illustrating the plasma ignition method according to the embodiment 1.

Referring to the waveform chart in FIG. 3, time t0-t1 correspond to the process in Steps S10-S11. At time t0, the controller 100 turns the high frequency signal to the ON state, and the high frequency signal HS is applied to the transmission path. The high frequency signal HS is an alternating-current signal having predetermined amplitude. As the load impedance initially does not match the characteristic impedance $Z_0$, the VSWR value largely exceeds the threshold value Vth.

Referring back to FIG. 2, the process moves to Step S13, and the controller 100 determines whether or not the calculated VSWR value is greater than the threshold value Vth for identifying the plasma generation. If, as a result of the determination, the VSWR value is determined to be greater than the threshold value Vth (YES), the process moves to Step S14, and the controller 100 transmits the control signal $S_{HV}$ to the high-voltage generator 103 to instruct the high-voltage generator 103 to start generating the high voltage HV. In response to the control signal $S_{HV}$, the high-voltage generator 103 generates the high voltage HV. The generated high voltage HV is supplied to the transmission path through the superimposed coil 104, and superimposed on the high frequency signal HS. Upon superimposition of the high voltage HV on the high frequency signal HS, the high voltage HV is also applied between the applied electrode 114 and the ground electrode 116, and a discharge is generated within the ceramic tube 112. Upon generation of the discharge, electrons generated by the ground electrode 116 work as pilot light, and this generates plasma. Once the plasma is generated, the plasma is maintained by the high frequency signal HS applied to the applied electrode 114. When the plasma is stably generated, a plasma jet is blown out from the front end of the ceramic tube 112, and can be used for necessary processing of semiconductor circuits and such. Once the plasma is generated, the load impedance on the side of the applied electrode 114 is converged to the characteristic impedance $Z_0$.

If, as a result of the determination in Step S13, the VSWR value becomes equal to or smaller than the threshold value Vth (NO), the process moves to Step S15, and the controller 100 transmits the control signal $S_{HV}$ to the high-voltage generator 103 to instruct the high-voltage generator 103 to stop supplying the high voltage HV. In response to the control signal $S_{HV}$, the high-voltage generator 103 stops supplying the high voltage HV. Only the high frequency signal HS is supplied to the transmission path. As the plasma is stably generated at this stage, the plasma may not disappear even after the high voltage HV is not superimposed.

Referring to FIG. 3, time t1-t3 correspond to the process in Steps S13 and S15. At time t1, the controller 100 turns the high voltage HV to the ON state, and the high voltage HV is superimposed on the high frequency signal HS. Superimposing the high voltage HV causes the high frequency signal HS to be an alternating-current signal that increases or decreases in the amplitude of the high frequency signal HS centering the high voltage HV. The application of the high voltage HV generates plasma that works as the pilot light. At time t2, plasma is generated. Along with this, the load impedance on the side of the applied electrode 114 is rapidly converged to the characteristic impedance $Z_0$. Along with the convergence of the load impedance, the ratio of the reflected wave reflected on the applied electrode 114 to the forward wave, that is, the VSWR value, also decreases. At time t3, when the VSWR value becomes equal to or smaller than the threshold value Vr, the controller 100 turns the high voltage HV to the OFF state. The superimposition of the high voltage HV is stopped, and the high frequency signal HS is turned to an alternating-current signal that oscillates centering zero volts. The VSWR value is converged to a value Vrmin that is a value when the plasma is stabilized.

While the above process describes the control of the case of automatically igniting plasma in the plasma standby state, it is also applied to a case of reigniting plasma when the plasma disappears during the plasma processing. In the process based on the flowchart in FIG. 2, after starting to supply the high voltage HV (Step S14), the calculation of the VSWR value (Step S12) and the determination of the VSWR value (Step S13) are periodically repeated. As the calculation and the determination of the VSWR value can be repeated at intervals such that the disappearance of plasma may not cause an adverse effect, it is possible to hold the process for a certain amount of time in the process of returning from Step S14 to Step S12. It is possible to employ a configuration in which the holding time can change appropriately depending the state of the plasma generating apparatus 1.

It is assumed that, for example, the state of the plasma has become unstable gas at time t4 in FIG. 3 due to a problem with the supply of the plasma, and the plasma has disappeared at time t5. The program process shown in FIG. 2 is executed regularly or irregularly regardless of the state of the plasma. Accordingly, at predetermined time, e.g., at time t6 in FIG. 3, the VSWR value is determined to be greater than the threshold value Vth (S13: YES), and the high voltage HV is superimposed on the high frequency signal HS (S14). By superimposing the high voltage HV, at time t7, pilot light of plasma is generated and plasma is generated. Once the plasma is generated, the reflected wave starts to decrease. Then, at time t8, the VSWR value is determined to be equal to or smaller than the threshold value Vth (S13: NO), and the superimposition of the high voltage HV is stopped (S15). Even if the plasma disappears in the middle of the process, the plasma ignition system according to this embodiment automatically performs the reignition process.

As described above, according to the process by the plasma ignition system of this embodiment, the generation of plasma is determined based on whether or not the VSWR value is greater than the predetermined threshold value Vth. If the VSWR value is greater than the threshold value Vth, it is determined to be a state before plasma is ignited or a state in which the plasma that has once been ignited has disappeared due to some reasons, and the high voltage HV is superimposed on the high frequency signal HS. Therefore, it is possible to easily and reliably ignite and reignite plasma without a person monitoring the state of plasma ignition and without manual handling.

Embodiment 2

The embodiment 2 according to the present invention is an improvement of the embodiment 1, and relates to a case in which the threshold value (first threshold value) to start supplying a high voltage for igniting plasma and the threshold value (second threshold value) to stop supplying the high voltage are different.

Configurations of the plasma generating apparatus 1 and the plasma ignition system 10 according to the embodiment 2 are the same as those according to the embodiment 1, and explanations for these configurations will be omitted. However, the embodiment 2 is different from the embodiment 1 in that the program process by the controller 100 corresponds a flowchart in FIG. 4.

In the embodiment 2, the controller 100 operates so as to superimpose the high voltage HV on the high frequency signal HS when the VSWR value is greater than a first threshold value Vth1, and stop superimposing the high voltage HV when the VSWR value becomes equal to or smaller than a second threshold value Vth2 after the high voltage HV is superimposed on the high frequency signal HS.

To be more specific, while the values for the threshold value Vth used in the determination for applying the high voltage HV to the high frequency signal HS and for stopping applying the high voltage HV are the same in the embodiment 1, different values are used in the embodiment 2. Specifically, in the embodiment 2, the first threshold value Vth1 is used to determine that the plasma is in the disappeared state, and the second threshold value Vth2 is used to determine that the state of plasma has changed from the disappeared state to the ignited state. It is preferable that the first threshold value Vth1 and the second threshold value Vth2 be in relation as shown below.

$$Vth1 > Vth2 \tag{3}$$

Superimposing the high voltage HV on the high frequency signal HS in order to ignite plasma in the state in which plasma is not generated or has disappeared, plasma is ignited by a discharge, and plasma is generated. Here, initially in the plasma generation, the state of the gas and such is often unstable, and the VSWR value does not fall immediately and possibly remains around the threshold value Vth. The plasma in this state is often weak or unstable. If the high voltage HV is applied to the plasma in this state because the VSWR value happened to exceed the threshold value Vth, there is a case that the plasma disappears due to an impact of the application. Further, when the plasma actually disappears, there is a possibility that so-called hunting in which a discharge by the high voltage HV and disappearance of plasma are repeated occurs, as the VSWR value exceeds the threshold value Vth and the high voltage HV is applied.

Therefore, according to the embodiment 2, different values are used for the first threshold value Vth1 for determining that the plasma is in the disappeared state and the second threshold value Vth2 for determining the state of plasma has changed from the disappeared state to the ignited state. The determination using different threshold values provides hysteresis for a process of high voltage application, and it is possible to cause the operation to transit in a stable manner.

Figure 4:
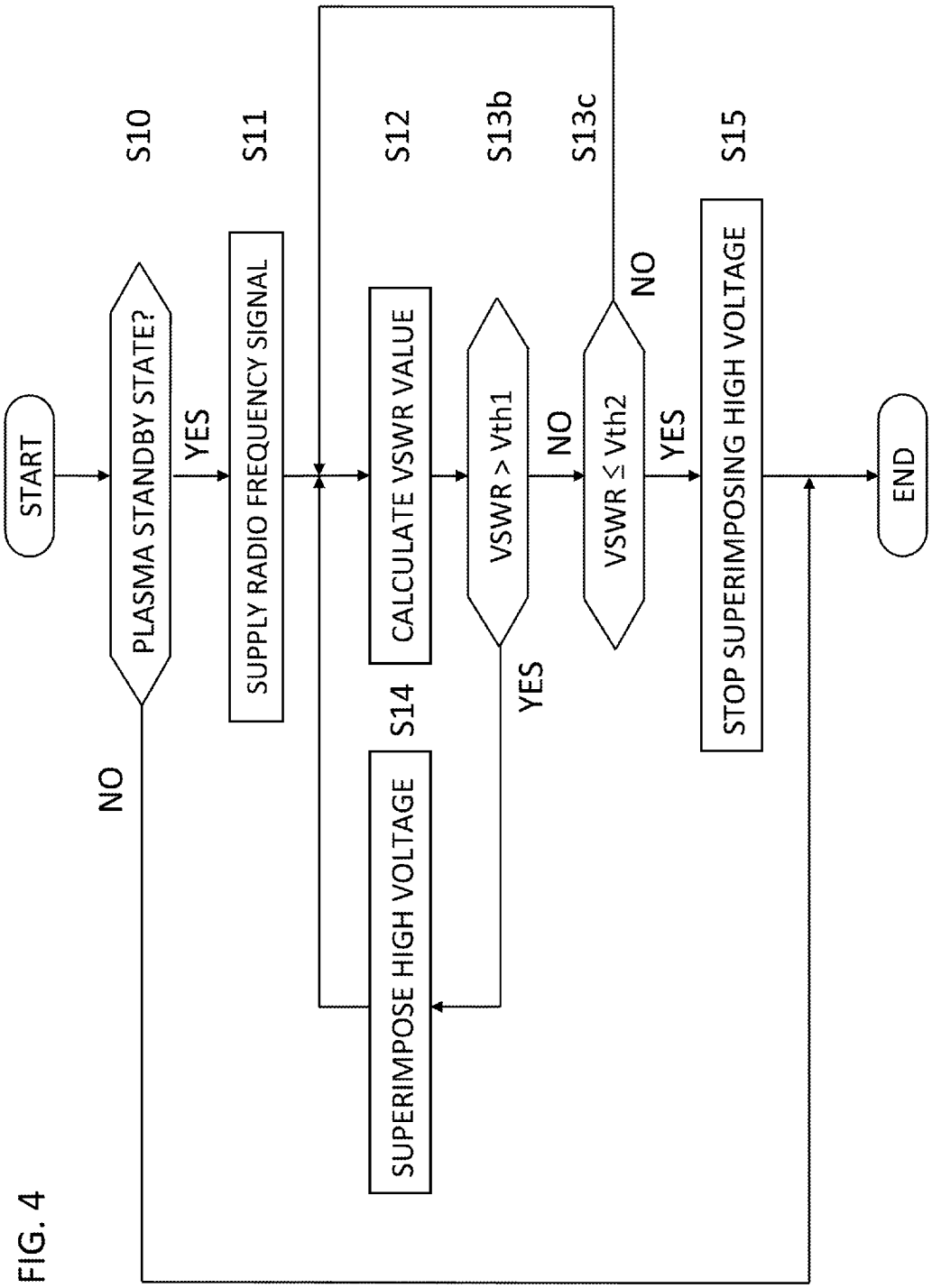
FIG. 4 is a flowchart illustrating a plasma ignition method according to an embodiment 2.

Next, a plasma ignition method according to the embodiment 2 will be described with reference to a flowchart in FIG. 4 and a waveform chart in FIG. 5. The flowchart in FIG. 4 shows a program process executed repeatedly or irregularly as needed. The same processing steps with those in the embodiment 1 are represented by the same step numbers.

In FIG. 4, the processing steps of determining the plasma standby state (S10), supplying the high frequency signal HS (S11), and calculating the VSWR value (S12) are the same as those described in the embodiment 1.

The process then moves to Step S13b, and the controller 100 determines whether or not the calculated VSWR value is greater than the first threshold value Vth1 for identifying generation of plasma. If, as a result of the determination, the VSWR value is determined to be greater than the first threshold value Vth1 (YES), the disappearance of the plasma is confirmed. Therefore, the process moves to Step S14, and the controller 100 transmits the control signal $S_{HV}$ to the high-voltage generator 103 to instruct the high-voltage generator 103 to start generating the high voltage HV. As a result of the processing, plasma is generated due to the high frequency signal HS supplied between the applied electrode 114 and the ground electrode 116.

If, as a result of the determination in Step S13b, the VSWR value is determined to be equal to or smaller than the first threshold value Vth1 (NO), the process moves to Step S13c, and the controller 100 further determines whether or not the VSWR value is equal to or smaller than the second threshold value Vth2. If, as a result of the determination, the VSWR value is determined to be equal to or smaller than the second threshold value Vth2 (YES), it possible to determine that the plasma has been disappeared is ignited stably. Then, the process moves to Step S15, and the controller 100 transmits the control signal $S_{HV}$ to the high-voltage generator 103 to instruct the high-voltage generator 103 to stop supplying the high voltage HV.

If, in Step S13c, the VSWR value is determined to be greater than the second threshold value Vth2 (NO), as it is a state in which plasma is not stably ignited and the plasma is weak or unstable, the controller 100 returns to the calculation of the VSWR value in Step S12 and continue superimposing the high voltage HV.

In the process of the flowchart in FIG. 4, similarly to the embodiment 1, it is possible to hold the process for a certain amount of time after superimposition of the high voltage HV starts (Step S14). It is possible to employ a configuration in which the holding time can change appropriately depending the state of the plasma generating apparatus 1.

Figure 5:
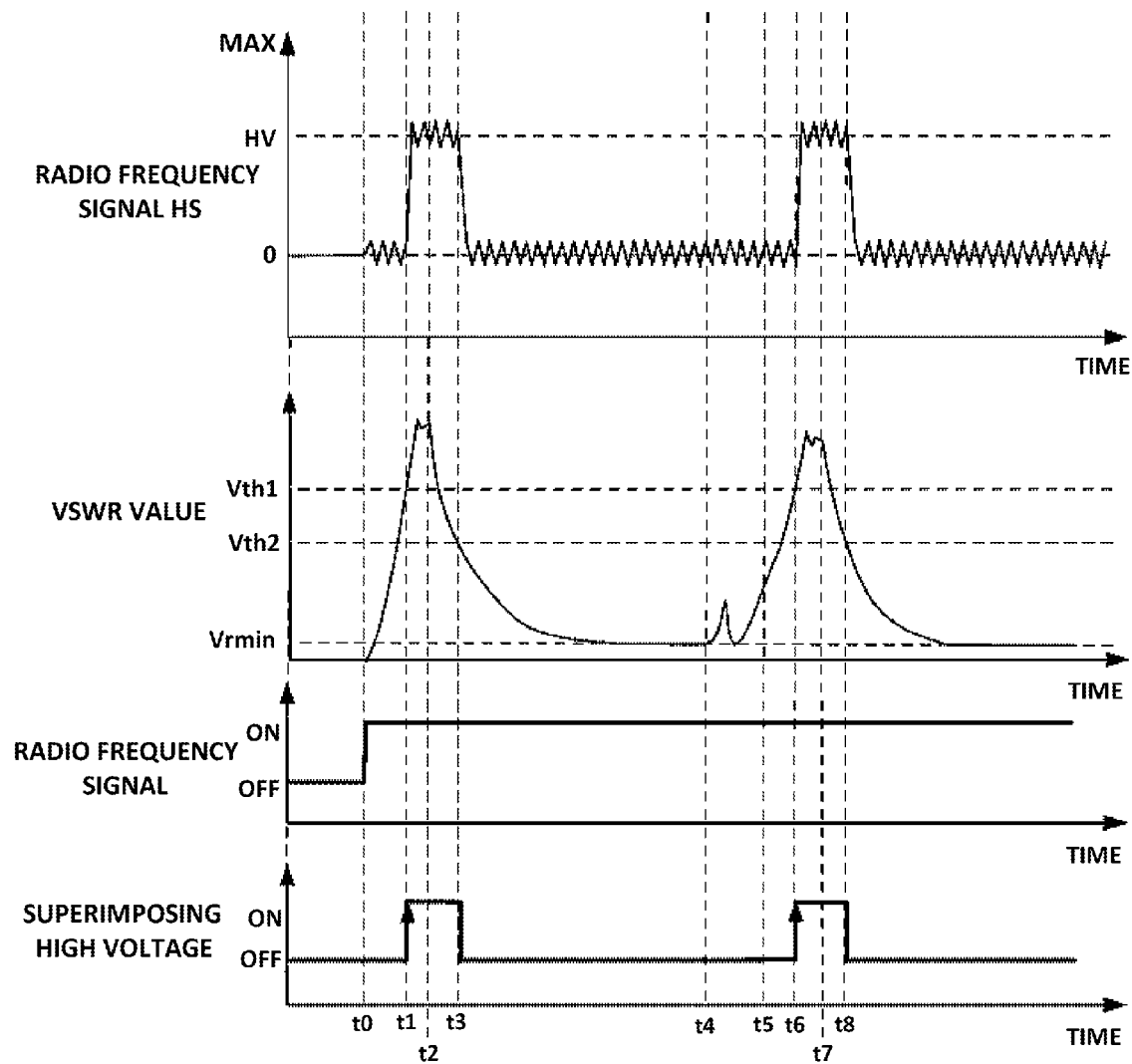
FIG. 5 is a waveform chart illustrating the plasma ignition method according to the embodiment 2.

In the waveform chart in FIG. 5, time t0-t2 correspond to the process in Steps S10-S13b, S13c, and S14. At time t0, the controller 100 turns the high frequency signal to the ON state, and the high frequency signal HS is applied to the transmission path. At time t1, if the VSWR value is determined to be greater than the first threshold value Vth1, the controller 100 turns the high voltage HV to the ON state, and the high voltage HV is superimposed on the high frequency signal HS. The application of the high voltage HV generates plasma that works as the pilot light. At time t2, plasma is generated. Along with this, the load impedance on the side of the applied electrode 114 is rapidly converged to the characteristic impedance $Z_0$, and the reflected wave amplitude value Vr reflected on the applied electrode 114 and the VSWR value also decrease. At time t3, when the VSWR value becomes equal to or smaller than the second threshold value Vth2, the controller 100 turns the high voltage HV to the OFF state. The superimposition of the high voltage HV is stopped, and the VSWR value is converged to the value Vrmin that is a value when the plasma is stabilized.

The reignition of plasma is similarly processed by the program. It is assumed that the state of the plasma has become unstable at time t4 in FIG. 5 due to a problem with the supply of the plasma gas, and the plasma has disappeared at time t5. The disappearance of plasma is determined by the fact that the VSWR value is greater than the first threshold value Vth1 at time t6.

As described above, according to the process by the plasma ignition system of the embodiment 2, the same effect as the embodiment 1 is provided, and the high voltage HV is supplied when the VSWR value is greater than the first threshold value Vth1. Further, the supply of the high voltage HV is stopped when the VSWR value is equal to or smaller than the second threshold value Vth2 that is smaller than the first threshold value Vth1. Therefore, it is possible to reliably detect that the plasma is in the disappeared state, and that the state of the plasma that has been in the ignited state has disappeared, and to control the plasma ignition in a stable manner.

Embodiment 3

An embodiment 3 according to the present invention is an improvement of the embodiment 1, and relates to a case of outputting a predetermined alarm signal and stopping superimposing the high voltage in a case in which the VSWR value remains greater than the predetermined threshold value Vth when a first time period elapses after the high voltage is superimposed on the high frequency signal. According to this embodiment, it is determined to be an abnormal state when plasma is not ignited for an extended period of time.

Configurations of the plasma generating apparatus 1 and the plasma ignition system 10 according to the embodiment 3 are the same as those according to the embodiment 1, and explanations for these configurations will be omitted. However, the embodiment 3 is different from the embodiment 1 in that the program process by the controller 100 corresponds a flowchart in FIG. 6.

In the embodiment 3, the controller 100 operates so as to output a predetermined alarm signal, stop supplying the high frequency signal and the plasma gas, and stop superimposing the high voltage HV in a case in which the VSWR value is greater than the threshold value Vth even when a first time period T1 elapses after the high voltage HV is superimposed on the high frequency signal HS.

To be more specific, in the embodiment 1, the high voltage HV is continued to be superimposed when the VSWR value is greater than the threshold value Vth. However, there is a case in which plasma is not generated indefinitely due to a failure in the radio-frequency power supply 101 or the high-voltage generator 103. In addition, plasma is not generated when the flow rate or the pressure of the plasma gas changes due to a defect occurring in a plasma supply system. Therefore, according to the embodiment 3, it is determined to be in an abnormal state when it is not possible to detect stable plasma generation after a certain period of time elapses.

Figure 6:
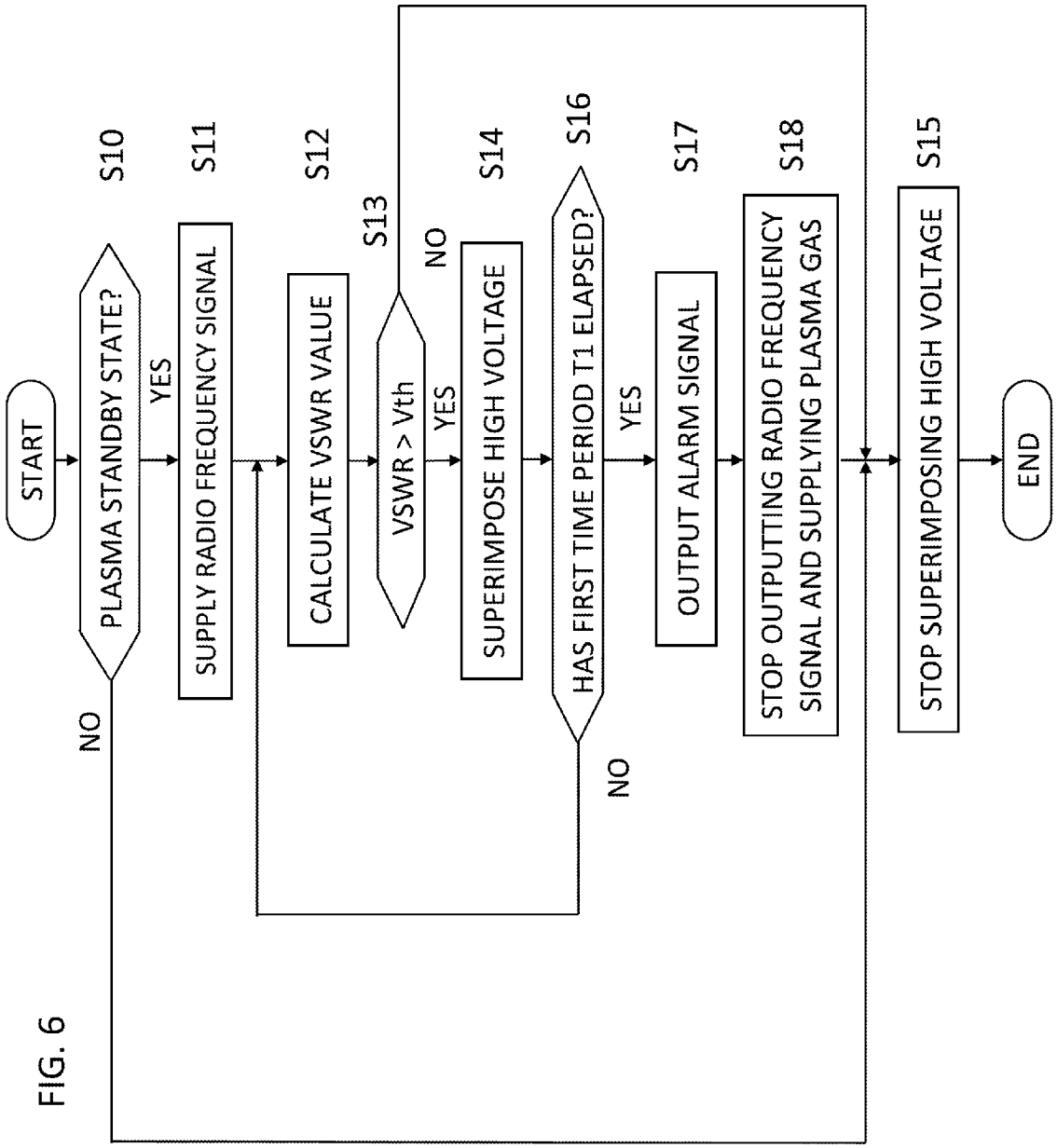
FIG. 6 is a flowchart illustrating a plasma ignition method according to an embodiment 3.

Next, a plasma ignition method according to the embodiment 3 will be described with reference to a flowchart in FIG. 6 and a waveform chart in FIG. 7. The flowchart in FIG. 6 shows a program process executed repeatedly or irregularly as needed. The same processing steps with those in the embodiment 1 are represented by the same step numbers.

In FIG. 6, the processing steps of determining the plasma standby state (S10), supplying the high frequency signal HS (S11), calculating the VSWR value (S12), comparing the VSWR value with the threshold value Vth (S13), superimposing the high voltage when the VSWR value is greater than the threshold value Vth (S14), and stopping superimposing the high voltage when the VSWR value is equal to or smaller than the threshold value Vth (S15) are the same as those described in the embodiment 1.

In the embodiment 3, Step S16 is executed after superimposing the high voltage in Step S14. In Step S16, the controller 100 determines whether or not a time period T elapsed after superimposition of the high voltage HV starts is greater than the first time period T1 that is a threshold time period for determining abnormity. The first time period T1 is set to be a period of time in which plasma is expected to be reliably generated after superimposing the high voltage if the supply of the plasma gas is in a normal state. If, as a result of the determination, the time period elapsed after superimposition of the high voltage HV starts is determined to have exceeded the first time period T1 (YES), it can be determined to be in the abnormal state. Therefore, the process moves to Step S17, and the controller 100 performs processing when the abnormity is determined, for example, outputs an alarm signal. Next, the process moves to Step S18, and the controller 100 stops the supply of the high frequency signal HS and the plasma gas. Then, the process moves to Step S15, and the controller 100 stops the superimposition of the high voltage HV. Here, conceivable examples of the output of the alarm signal include a display in a display device, lighting an alarm lamp, making sound of an alarm buzzer, and such.

Here, in Step S16, if the time period elapsed after superimposition of the high voltage HV starts is determined to have not exceeded the first time period T1 (NO), it is determined to be within a normal waiting time period for plasma ignition, and the process returns to the calculation of the VSWR value (S12).

Figure 7:
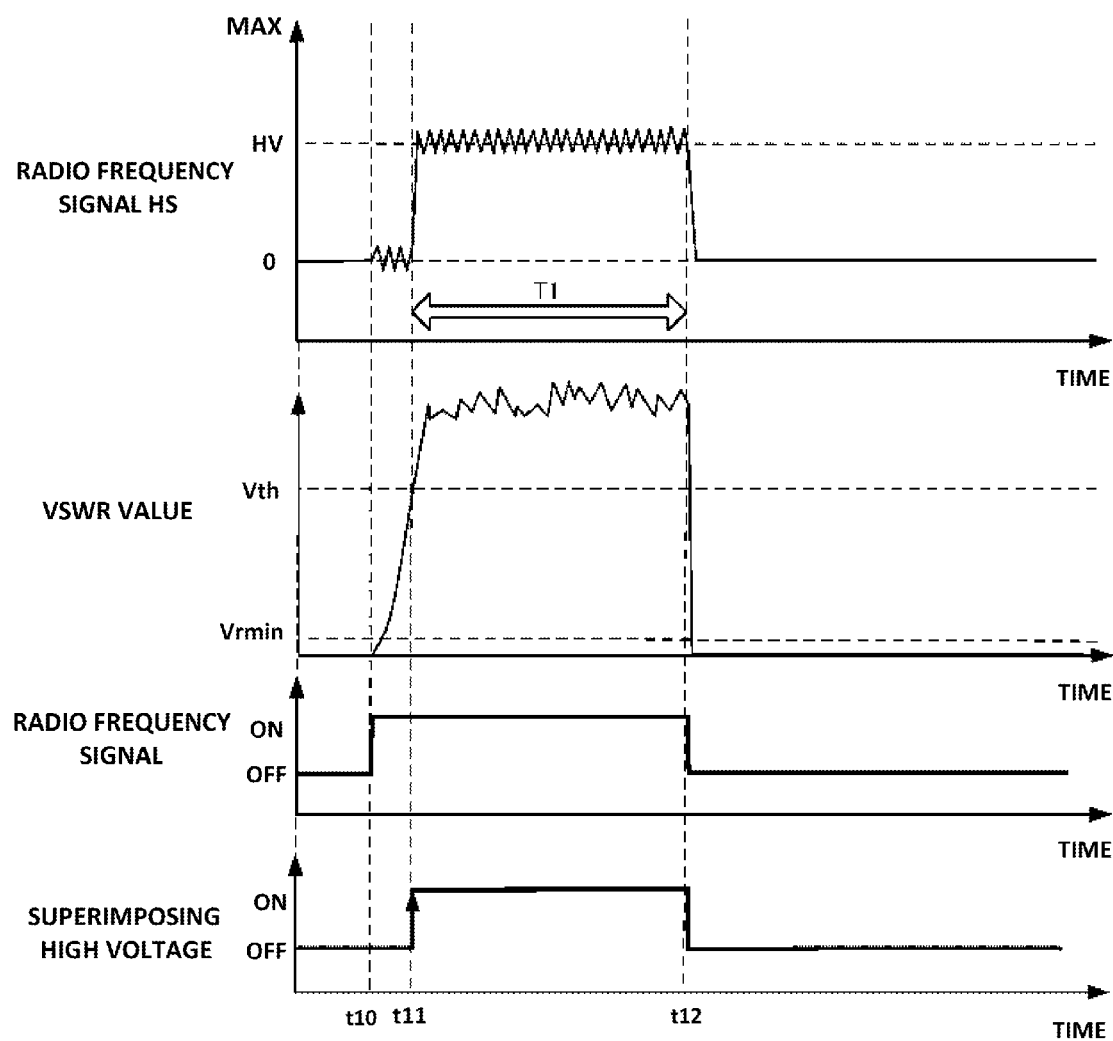
FIG. 7 is a waveform chart illustrating the plasma ignition method according to the embodiment 3.

In the waveform chart in FIG. 7, time t10-t11 correspond to the process in Steps S10-S13. At time t10, the controller 100 turns the high frequency signal to the ON state, and the high frequency signal HS is applied to the transmission path. At time t11, if the VSWR value is determined to be greater than the threshold value Vth, the controller 100 turns the high voltage HV to the ON state, and the high voltage HV is superimposed on the high frequency signal HS.

Here, if some kind of abnormity has occurred, plasma that works as the pilot light is not generated even when the high voltage HV is applied, or plasma is not stably generated even when the plasma that works as the pilot light is generated. In such a state, time passes in a state in which the load impedance is not converged and the VSWR value remains exceeding the threshold value Vth for detecting stable generation of plasma. If time passes from time t11 at which the high voltage HV is applied to time t12 at which the first time period T1 is elapsed while this state is maintained, the controller 100 determines that the abnormal state has occurred. Then, the controller 100 turns the high frequency signal and the superimposition of the high voltage to the OFF state, and outputs an alarm signal.

As described above, according to the process by the plasma ignition system of the embodiment 3, the same effect as the embodiment 1 is provided. Additionally, it is determined to be in the abnormal state when the VSWR value is greater than the threshold value Vth if the first time period T1 elapses after the high voltage HV is superimposed, and an alarm signal is outputted. Therefore, it is possible to reliably detect a failure occurring in the plasma generating apparatus 1, and inform the administrator that maintenance is needed.

Embodiment 4

An embodiment 4 according to the present invention is an improvement of the embodiment 1, and relates to a case of changing the voltage value of the high voltage in a case in which the VSWR value remains greater than the predetermined threshold value Vth when a second time period elapses after the high voltage is superimposed on the high frequency signal. According to this embodiment, the high voltage to be applied is changed when plasma is not ignited within a certain period of time.

Configurations of the plasma generating apparatus 1 and the plasma ignition system 10 according to the embodiment 4 are the same as those according to the embodiment 1, and explanations for these configurations will be omitted. However, the embodiment 4 is different from the embodiment 1 in that the program process by the controller 100 corresponds a flowchart in FIG. 8.

In the embodiment 4, the controller 100 operates so as to change the voltage value of the high voltage HV in a case in which the VSWR value is greater than the threshold value Vth even when a second time period T2 elapses after the high voltage HV is superimposed on the high frequency signal HS.

To be more specific, in the embodiment 1, the high voltage HV superimposed on the high frequency signal HS is not changed. However, there is a case in which it is possible to easily cause a discharge depending on the state of the plasma gas by changing the voltage value of the high voltage HV applied to the high frequency signal HS. Therefore, according to the embodiment 4, the voltage value of the high voltage HV to be superimposed is controlled to change when plasma is not generated after the second time period T2 elapses. In particular, this embodiment exemplifies a case in which the voltage value of the high voltage HV is increased in a stepwise manner.

Figure 8:
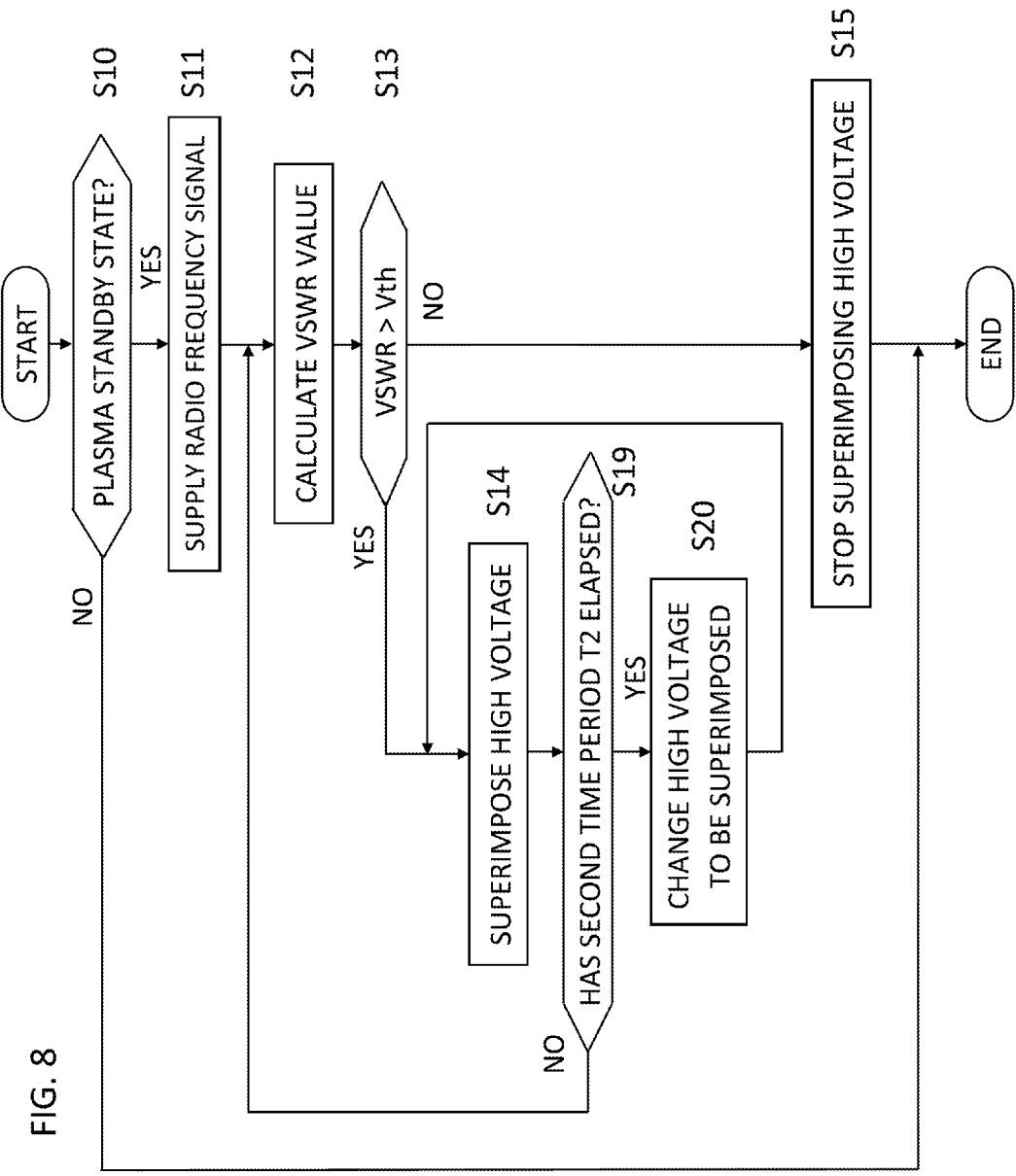
FIG. 8 is a flowchart illustrating a plasma ignition method according to an embodiment 4.

Next, a plasma ignition method according to the embodiment 4 will be described with reference to a flowchart in FIG. 8 and a waveform chart in FIG. 9. The flowchart in FIG. 8 shows a program process executed repeatedly or irregularly as needed. The same processing steps with those in the embodiment 1 are represented by the same step numbers.

In FIG. 8, the processing steps of determining the plasma standby state (S10), supplying the high frequency signal HS (S11), calculating the VSWR value (S12), comparing the VSWR value with the threshold value Vth (S13), superimposing the high voltage when the VSWR value is greater than the threshold value Vth (S14), and stopping superimposing the high voltage when the VSWR value is equal to or smaller than the threshold value Vth (S15) are the same as those described in the embodiment 1.

In the embodiment 4, Step S19 is executed after superimposing the high voltage in Step S14. In Step S19, the controller 100 determines whether or not the time period T elapsed after superimposition of the high voltage HV starts is greater than the second time period T2 that is a threshold for changing the voltage value. The second time period T2 is set to be shorter than a period of time in which plasma is expected to be reliably generated after superimposing the high voltage if the supply of the plasma gas is in a normal state (the first time period T1 in the embodiment 3). The second time period T2 is also set depending on the number of steps by which the voltage value is changed.

If, as a result of the determination, the time period elapsed after superimposition of the high voltage HV starts is determined to have exceeded the second time period T2 (YES), it is determined that the voltage value of the high voltage HV to be superimposed should be changed. Therefore, the process moves to Step S20, and the controller 100 outputs the control signal $S_{HV}$ to the high-voltage generator 103 to instruct the high-voltage generator 103 to increase the voltage value of the high voltage HV to be superimposed by a predetermined number of steps ($\Delta V$, for example). Then, the process moves to Step S14, and the high-voltage generator 103 generates the high voltage HV at the instructed voltage value, and superimposes the generated high voltage HV on the high frequency signal HS. If, as a result of the determination, the time period elapsed after superimposition of the high voltage HV starts is determined to have not exceeded the second time period T2 (NO), the process returns to the calculation of the VSWR value (S12).

Here, in Step S19, while the elapsed time period T elapsed from a time point at which superimposition of the high voltage HV has started is compared with the second time period T2 for the first time, the elapsed time period T from a time point at which the voltage value of the high voltage HV has been changed previously is compared with the second time period T2 for the second time and thereafter. Specifically, every time the second time period T2 elapses, an internal timer that counts the elapsed time period is reset.

Figure 9:
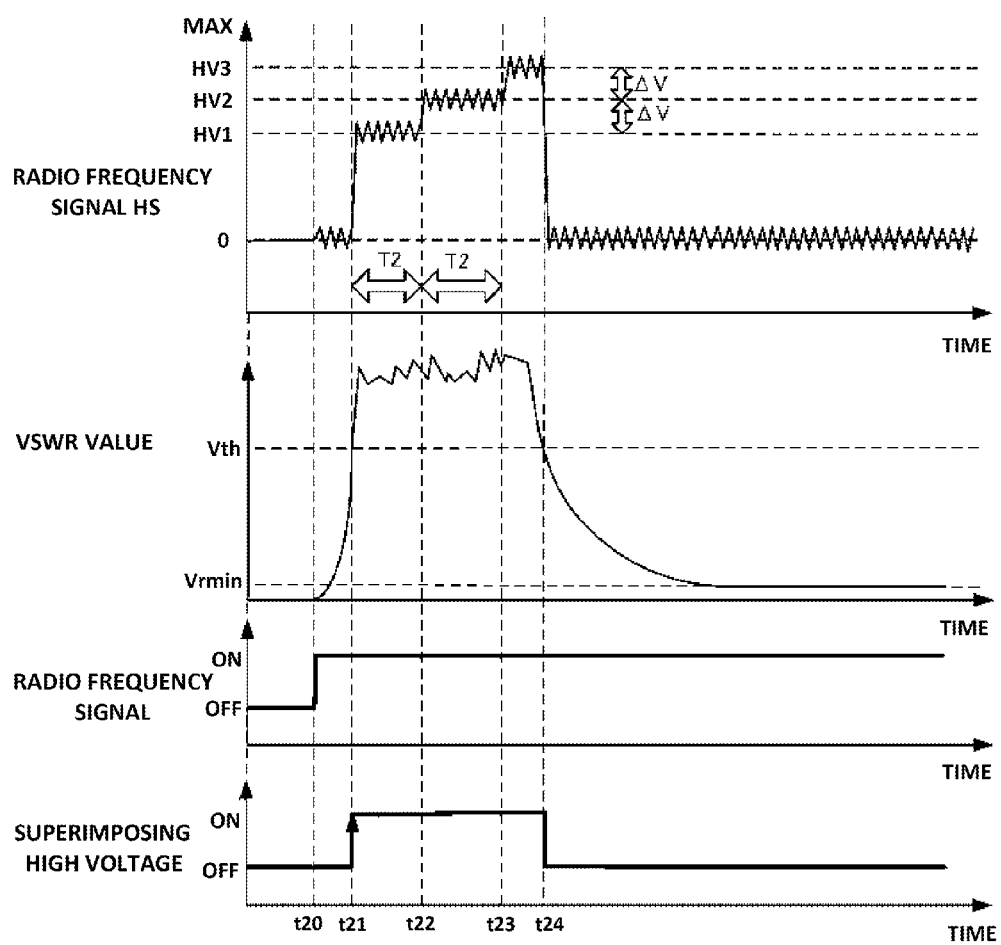
FIG. 9 is a waveform chart illustrating the plasma ignition method according to the embodiment 4.

In the waveform chart in FIG. 9, time t20-t21 correspond to the process in Steps S10-S13. At time t20, the controller 100 turns the high frequency signal to the ON state, and the high frequency signal HS is applied to the transmission path. At time t21, if the VSWR value is determined to be greater than the threshold value Vth, the controller 100 turns the high voltage HV to the ON state, and a high voltage HV1 (initial value) is superimposed on the high frequency signal HS. As is clearly seen from FIG. 9, the first time period T1 is longer than the second time period T2, and is equal to a time period from time t21 to time t24.

Here, depending on the state of the plasma gas, there is a case in which plasma is not stably generated even when the high voltage HV at the predetermined voltage value is applied. In such a state, time passes in a state in which the load impedance is not converged and the VSWR value remains exceeding the threshold value Vth for detecting stable generation of plasma. At time t22 at which the second time period T2 elapses after time t21 at which superimposition of the high voltage HV has started previously, the voltage value of the high voltage HV to be superimposed on the high frequency signal HS is changed to a high voltage HV2 that is higher than the high voltage HV1 by a step $\Delta V$. If plasma is not generated even with the high voltage HV2 after the change, the VSWR value still remains above the threshold value Vth. Therefore, at time t23 at which the second time period T2 elapses after time t22 at which the voltage value of the high voltage HV has been changed previously, the voltage value of the high voltage HV to be superimposed on the high frequency signal HS is changed to a high voltage HV3 that is higher than the high voltage HV2 by another step $\Delta V$. At time t24, if plasma is generated with the high voltage HV3 after the change, the VSWR value is converged and becomes equal to or smaller than the threshold value Vth, and as a result, the superimposition of the high voltage HV is stopped.

As described above, according to the process by the plasma ignition system of the embodiment 4, the same effect as the embodiment 1 is provided, and as the voltage value of the high voltage HV to be superimposed is changed every time when the second time period T2 elapses, it is possible to reliably ignite plasma even when the state of the plasma gas varies.

Other Modified Examples

The present invention is not limited to the above embodiments, and can be altered as needed without departing from the spirit of the present invention.

Figure 10:
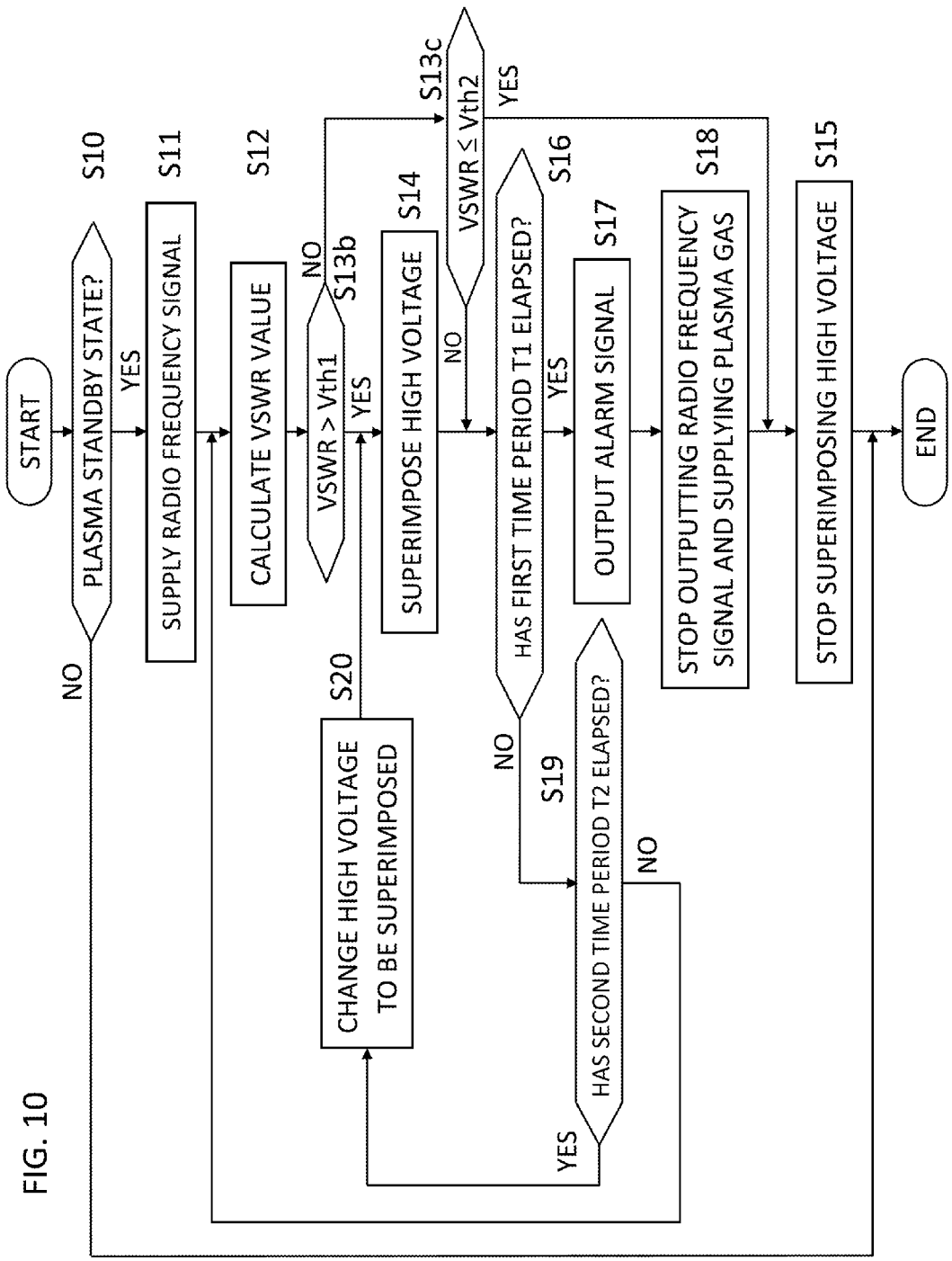
FIG. 10 is a flowchart illustrating a plasma ignition method according to an application example.

For example, the embodiments 1 to 4 are not exclusive to each other, and two or more embodiments can be freely combined and put into application. A flowchart in FIG. 10 shows an application example when all of the embodiments 1 to 4 are incorporated. According to this application example, it is possible to provide a plasma ignition method providing the same effect as the embodiment 1, as well as all of the effects characteristic of the embodiments 2 to 4.

Further, according to the embodiments 1 to 4, as illustrated in FIG. 1, while the plasma generating apparatus 1 is provided with one ceramic tube 112, the apparatus can generate plasma using a plurality of ceramic tubes.

Figure 11:
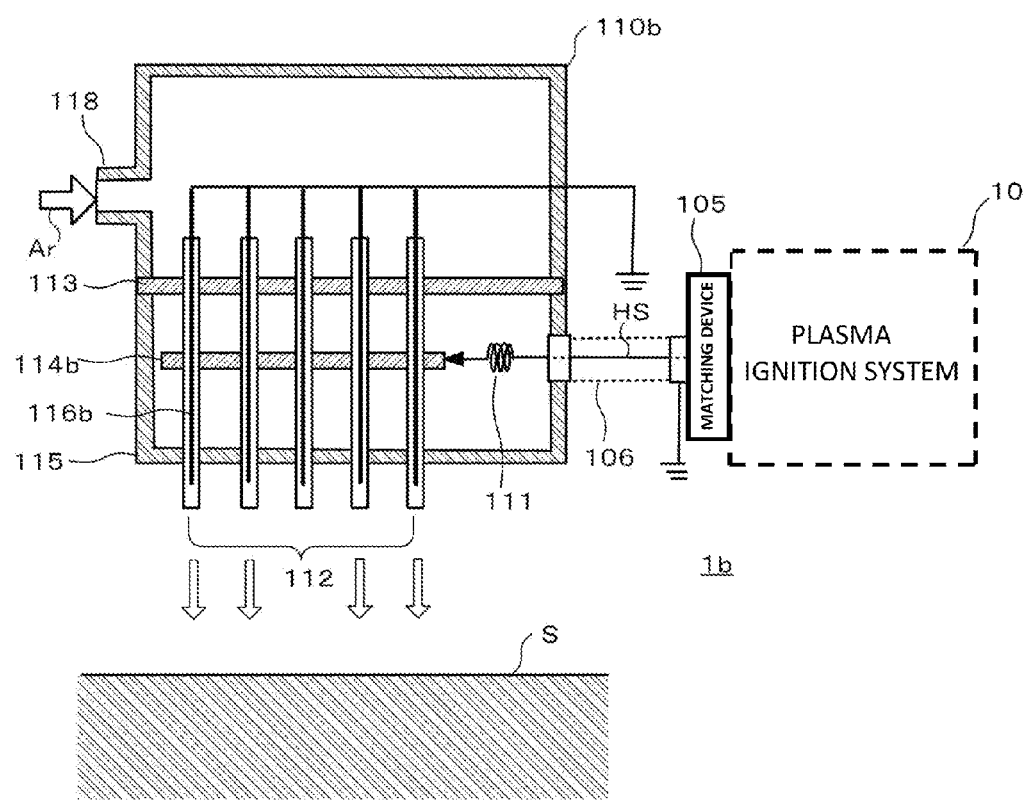
FIG. 11 is a configuration diagram of a plasma generating apparatus according to a modified example.

FIG. 11 shows a configuration diagram of a plasma generating apparatus 1b provided with a plurality of ceramic tubes 112. The same or like components as those in the embodiment 1 (FIG. 1) are represented by the same or like reference numerals.

The plasma generating apparatus 1b is provided with the plasma ignition system 10, a gas chamber 110b, the reactance correction coil 111, the ceramic tubes 112, an applied electrode 114b, the shielding cover 115, ground electrodes 116b, and the plasma gas supply inlet 118. In particular, the modified example is characteristics in that the plurality of ceramic tubes 112 are provided.

The gas chamber 110b is a gas filling chamber for supplying a plasma gas similarly to the gas chamber 110 in the embodiment 1, but different in that a frame 113 having the plurality of ceramic tubes 112 is provided. The frame 113 is configured by a conductive material, and is a plated body having holding holes through which the ceramic tubes 112 are respectively held. Each holding hole is configured to have a diameter as large as an external diameter of the ceramic tubes so as to be able to hold the corresponding ceramic tube 112. The plurality of ceramic tubes 112 are held by the frame 113 such that openings of the tubes face a cleaning surface S. The applied electrode 114b is configured by a conductive material such as brass, and is a plated body having insertion holes through which the ceramic tubes 112 held by the frame 113 are respectively inserted. Each insertion hole is configured to have a diameter slightly larger than the external diameter of the ceramic tubes 112. The applied electrode 114b is, similarly to the embodiment 1, electrically connected to the coaxial cable 106 via the reactance correction coil 111, and the high frequency signal HS outputted from the plasma ignition system 10 and the matching device 105 is supplied to the applied electrode 114b. The gas chamber 110b is provided with a shielding cover 115 so as to enclose a part of each ceramic tube 112 and applied electrode 114b. The shielding cover 115 is configured by a conductive material, and to be able to shield electromagnetic waves generated by the applied electrode 114b. Further, the ground electrodes 116b are provided respectively along axial cores of the ceramic tubes 112. The configurations and the operations of the plasma ignition system 10 and the matching device 105 are similar to those according to the embodiments 1 to 4.

According to the plasma generating apparatus 1b of the modified example, similarly to the embodiments 1 to 4, when the plasma gas is supplied to the plasma gas supply inlet 118, and the high voltage HV is supplied to the applied electrode 114b from the plasma ignition system 10, plasma is generated due to a discharge. Further, the plasma is stably maintained by supplying the high frequency signal HS from the plasma ignition system 10. In particular, according to the plasma generating apparatus 1b of the modified example, it is configured such that plasma jets can be blown out from the plurality of ceramic tubes 112 to the cleaning surface S. Thus, processing (cleaning) by the plasma jets can be performed over a wide range. Moreover, the plasma ignition method according to the present invention can be applied to the plasma generating apparatus 1b of the above example.

INDUSTRIAL APPLICABILITY

The plasma ignition system and the plasma ignition method according to the present invention are applicable in an environment in which it is desired to automatically provide air ventilation in an enclosed region without manual handling.

The present invention can be applied, according to purposes and applications, as an embodiment appropriately combined or an application example that is altered or improved, and not limited to the embodiments or the application example described through the Modes For Carrying Out The Invention. An embodiment and an application example appropriately combined according to purposes and applications are also included in the technical scope of the present invention, in so far as not departing from the technical scope of the present invention.

| DESCRIPTION OF REFERENCE CHARACTERS | |
|---|---|
| 1 | Plasma Generating Apparatus |
| 10 | Plasma Ignition System |
| 100 | Controller |
| 101 | High-Frequency Power Supply |
| 102 | Traveling Wave/Reflected Wave Detector |
| 103 | High-Voltage Generator |
| 104 | Superimposed Coil |
| 105 | Matching Device |
| 106 | Coaxial Cable |
| 110, 110b | Gas Chamber |
| 111 | Reactance Correction Coil |
| 112 | Ceramic Tube |
| 114, 114b | Applied Electrode |
| 115 | Shielding Cover |
| 116, 116b | Ground Electrode |
| 118 | Plasma Gas Supply Inlet |
| HS | High Frequency Signal |
| HV | High Voltage |
| HV1 | High Voltage |
| HV2 | High Voltage |
| HV3 | High Voltage |
| M | Storage Medium |
| S | Cleaning Surface (Worked Surface) |
| $S_{HS}$ | Control Signal |
| $S_{HV}$ | Control Signal |
| Vf | Traveling Wave Amplitude Value |
| Vr | Reflected Wave Amplitude Value |
| Z | Load Impedance |
| $Z_0$ | Characteristic Impedance |
| Γ (Gamma) | Voltage Reflection Coefficient |

The invention claimed is:

1. A plasma generating apparatus comprising:
a gas-ignition chamber for igniting or reigniting plasma;
a plasma ignition system for generating a predetermined high frequency signal and a predetermined high voltage;
a coaxial cable for transmitting the high frequency signal and the high voltage, the coaxial cable connected between the gas-ignition chamber and the plasma ignition system;
the gas-ignition chamber comprising
　a first connector for connecting the coaxial cable,
　an applied electrode for applying the high frequency signal and the high voltage thereto,
　a ground electrode for generating plasma between the applied electrode and thereof,
　an impedance correction coil for correcting impedance on the high frequency signal and impedance of the applied electrode, the impedance correction coil being disposed between the first connector and the applied electrode,
　a gas filling chamber for filling an inert gas supplied from a plasma gas supply inlet, and
　a ceramic tube having a first end and a second end, the applied electrode being disposed outside of the ceramic tube and the ground electrode being disposed inside the ceramic tube, when inert gas is fed into the first end, plasma is generated inside the ceramic tube, and radiating plasma from the second end to a cleaning target;
the plasma ignition system comprising
　a radio-frequency power supply for supplying the high frequency signal to the applied electrode in the gas-ignition chamber,
　a high-voltage generator for generating the high voltage,
　a superimposed coil for adding the high voltage to the high frequency signal, a forward wave/reflected wave detector for detecting a forward wave and a reflected wave of the high frequency signal, a matching device for matching impedance on a side of the radio-frequency power supply and impedance on a side of the applied electrode, a second connector for connecting the coaxial cable, and a controller for superimposing the high voltage to the high frequency signal when a ratio of the reflected wave to the forward wave is greater than a predetermined threshold value, and the controller ceasing to superimpose the high voltage when the ratio becomes equal to or smaller than the predetermined threshold value; and the coaxial cable comprising a covering that is grounded through at least one of the first and second connectors.

2. The plasma generating apparatus according to claim 1, wherein the ground electrode is extended along the axis core of the ceramic tube, a tip of the ground electrode is disposed between a covering area of the applied electrode and the second end serving as an opening of the ceramic tube, the ground electrode comprising a wire made of a metal having a high melting point to withstand high temperatures of plasma generated from environment, the ground electrode being grounded to an exterior of the gas-ignition chamber, and the applied electrode has a tubular cross-section, the applied electrode facing a portion of the ground electrode to enclose an exterior of the ceramic tube, and the applied electrode comprising an oxidation-resistant metal.

3. The plasma generating apparatus according to claim 1, wherein the gas-ignition chamber is provided with a plurality of ceramic tubes, the ground electrode is extended along the axis core of the each ceramic tube, each tip of the ground electrode is disposed between a covering area of the applied electrode and the each second end serving as a opening of the ceramic tubes, the ground electrode comprises a wire made of a metal having a high melting point to withstand high temperatures of plasma generated from environment, the ground electrode being grounded to an exterior of the gas-ignition chamber, and the applied electrode is a plate-like body having insertion holes through which the ceramic tubes are respectively inserted, the applied electrode facing a portion of the ground electrode to enclose an exterior of the ceramic tube, and the applied electrode comprising an oxidation-resistant metal.

4. A plasma ignition system for supplying a predetermined high frequency signal and a predetermined high voltage to ignite plasma, the plasma ignition system comprising:

a radio-frequency power supply for generating a high frequency signal;

a high-voltage generator for generating the high voltage;

a superimposed coil for adding the high voltage to the high frequency signal;

a forward wave/reflected wave detector for detecting a forward wave and a reflected wave of the high frequency signal;

a matching device for matching impedance on a side of the radio-frequency power supply and impedance on a side of the applied electrode;

a second connector for connecting the coaxial cable; and a controller for superimposing the high voltage to the high frequency signal when a ratio of the reflected wave to the forward wave is greater than a predetermined threshold value, and the controller ceasing to superimpose the high voltage when the ratio becomes equal to or smaller than the predetermined threshold value;

wherein the radio frequency power supply is configured to be able to supply the high frequency signal within a range from 0.1 W to 30 W, and wherein the high-voltage generator is configured to be able to generate the high voltage within an amplitude range from 0.8 kV to 2.0 kV.

5. A gas-ignition chamber for receiving a predetermined high frequency signal and a high voltage from a plasma ignition system, the gas-ignition chamber comprising:

a first connector for receiving the predetermined high frequency signal and high voltage;

an applied electrode to be applied the predetermined high frequency signal and high voltage;

a ground electrode for generating plasma between the applied electrode and thereof;

an impedance correction coil for correcting impedance on the high frequency signal and impedance of the applied electrode, the impedance correction coil provided between the first connector and the applied electrode;

a gas filling chamber for filling an inert gas supplied from a plasma gas supply inlet; and a ceramic tube having a first end and a second end, the applied electrode being disposed outside of the ceramic tube and the ground electrode being disposed inside the ceramic tube, when inert gas is fed into the first end, plasma is generated inside the ceramic tube, and radiating plasma from the second end to a cleaning target.

6. The gas-ignition chamber according to claim 5, wherein the ground electrode is extended along the axis core of the ceramic tube, a tip of the ground electrode is disposed between a covering area of the applied electrode and the second end serving as an opening of the ceramic tube, the ground electrode comprising a wire made of a metal having a high melting point to withstand high temperatures of plasma generated from environment, the ground electrode being grounded to an exterior of the gas-ignition chamber, and the applied electrode has a tubular cross-section, the applied electrode facing a portion of the ground electrode to enclose an exterior of the ceramic tube and, the applied electrode comprising an oxidation-resistant metal.

7. The gas-ignition chamber according to claim 5, wherein the gas-ignition chamber is provided with a plurality of ceramic tubes, the ground electrode is extended along the axis core of the each ceramic tube, each tip of the ground electrode is disposed between a covering area of the applied electrode and the each second end serving as a opening of the ceramic tubes, the ground electrode comprising a wire made of a metal having a high melting point to withstand high temperatures of plasma generated from environment, the ground electrode being grounded to an exterior of the gas-ignition chamber, and the applied electrode is a plate-like body having insertion holes through which the ceramic tubes are respectively inserted, the applied electrode facing a portion of the ground electrode to enclose an exterior of the ceramic tube, and the applied electrode comprising an oxidation-resistant metal.

* * * * *